(12) United States Patent
Tanaka et al.

(10) Patent No.: US 12,191,255 B2
(45) Date of Patent: Jan. 7, 2025

(54) INTERCONNECT SUBSTRATE HAVING GROOVE AROUND PAD

(71) Applicant: SHINKO ELECTRIC INDUSTRIES CO., LTD., Nagano (JP)

(72) Inventors: Hikaru Tanaka, Nagano (JP); Takashi Kasuga, Nagano (JP); Tomoyuki Shimodaira, Nagano (JP); Hitoshi Kondo, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 18/046,557

(22) Filed: Oct. 14, 2022

(65) Prior Publication Data

US 2023/0120515 A1 Apr. 20, 2023

(30) Foreign Application Priority Data

Oct. 19, 2021 (JP) ................................. 2021-171147

(51) Int. Cl.
*H01L 23/532* (2006.01)
*H01L 23/482* (2006.01)
*H01L 23/522* (2006.01)

(52) U.S. Cl.
CPC ...... *H01L 23/5329* (2013.01); *H01L 23/4827* (2013.01); *H01L 23/5226* (2013.01); *H01L 23/53228* (2013.01); *H01L 23/53242* (2013.01)

(58) Field of Classification Search
CPC .... H01L 23/49822; H05K 2201/09036; H05K 1/113
See application file for complete search history.

(56) References Cited

U.S. PATENT DOCUMENTS

| | | | |
|---|---|---|---|
| 2008/0149383 A1 | 6/2008 | Kaneko et al. | |
| 2010/0147560 A1* | 6/2010 | Kaneko | H01L 23/13 174/250 |
| 2015/0144384 A1* | 5/2015 | Ho | H01L 21/486 174/257 |
| 2016/0044792 A1* | 2/2016 | Kaneko | H05K 3/4682 205/125 |
| 2018/0096926 A1* | 4/2018 | Imafuji | H01L 23/3185 |
| 2022/0037249 A1* | 2/2022 | Kim | H01L 23/367 |
| 2023/0275015 A1* | 8/2023 | Tanaka | H01L 23/49811 174/257 |

FOREIGN PATENT DOCUMENTS

JP 2008-141070 6/2008

* cited by examiner

*Primary Examiner* — Nduka E Ojeh
*Assistant Examiner* — Bruce R. Smith
(74) *Attorney, Agent, or Firm* — IPUSA, PLLC (57) ABSTRACT

An interconnect substrate includes a pad for external connection and an insulating layer, wherein a portion of a lower surface of the pad is covered with the insulating layer, wherein an upper surface of the pad is situated at a lower position than an upper surface of the insulating layer, and wherein a groove whose bottom surface is formed by the insulating layer is formed around the pad in a plan view, and has an opening on an upper surface side of the insulating layer.

9 Claims, 7 Drawing Sheets

INTERCONNECT SUBSTRATE HAVING GROOVE AROUND PAD

CROSS-REFERENCE TO RELATED APPLICATIONS

The present application is based on and claims priority to Japanese Patent Application No. 2021-171147 filed on Oct. 19, 2021, with the Japanese Patent Office, the entire contents of which are incorporated herein by reference.

FIELD

The disclosures herein relate to interconnect substrates and methods of making the same.

BACKGROUND

Interconnect substrates include, for example, pads exposed from an insulating layer disposed as an outermost layer. These pads serve as external connection pads for electrical connection to a motherboard or the like, for example. The process of making such an interconnect substrate includes, for example, a step of forming pads for external connection on the upper surface of a support body, a step of forming an insulating layer covering the pads for external connection on the upper surface of the support body, and a step of removing the support body.

When the area of the upper surface of a pad is large, its capacitance increases, which causes deterioration of an electric signal. In recent years, there has been a demand for reducing the area of the upper surface of a pad in order to reduce its capacitance. However, compatibility with a conventional interconnect substrate needs to be taken into consideration in order to use a socket or the like for connection with an interconnect substrate. From this point of view, the size of an opening of an insulating layer around a pad should not be changed even when the size of the pad is reduced.

In order to meet these requirements, the perimeter of an opening of an insulating layer around a pad should not be changed in a plan view, while the outer edge of a pad is moved inwards, away from the perimeter of the opening of the insulating layer. However, in the above-described interconnect substrate, it is difficult to move only the outer edge of a pad such that it is further in than the perimeter of the opening of the insulating layer.

It may be preferable to provide an interconnect substrate in which the outer edge of a pad for external connection is located further in than the perimeter of an opening of an insulating layer in a plan view.

RELATED-ART DOCUMENT

Patent Document

[Patent Document 1] Japanese Laid-Open Patent Publication No. 2008-141070

SUMMARY

According to an aspect of the embodiment, an interconnect substrate includes a pad for external connection and an insulating layer, wherein a portion of a lower surface of the pad is covered with the insulating layer, wherein an upper surface of the pad is situated at a lower position than an upper surface of the insulating layer, and wherein a groove whose bottom surface is formed by the insulating layer is formed around the pad in a plan view, and has an opening on an upper surface side of the insulating layer.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments of the present invention will be described with reference to the accompanying drawings.

In the following, embodiments of the present invention will be described with reference to the accompanying drawings. In the drawings, the same components are referred to by the same reference characters, and a duplicate description thereof may be omitted.

First Embodiment

Structure of Interconnect Substrate

Figure 1A:
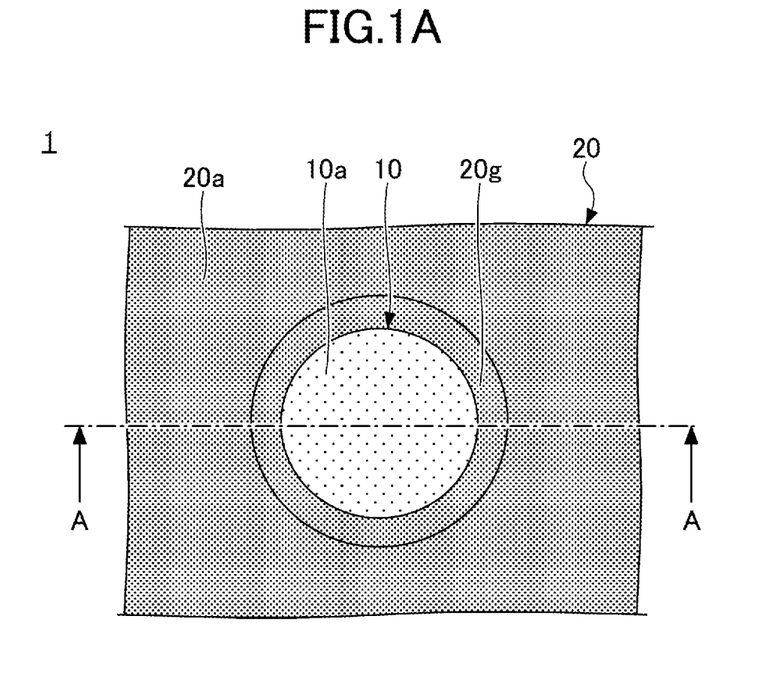
FIGS. 1A and 1B are drawings illustrating an interconnect substrate according to a first embodiment.
Figure 1B:
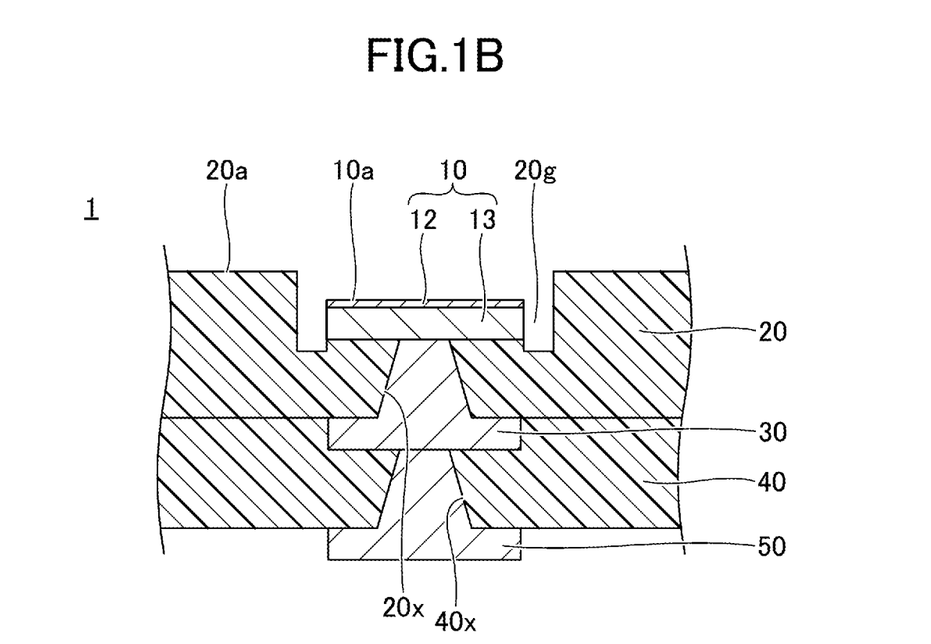

FIGS. 1A and 1B are drawings illustrating an interconnect substrate according to a first embodiment. FIG. 1A is a partial plan view, and FIG. 1B is a partial cross-sectional view taken along the line A-A in FIG. 1A.

Referring to FIGS. 1A and 1B, the interconnect substrate 1 includes a pad 10, an insulating layer 20, an interconnect layer 30, an insulating layer 40, and an interconnect layer 50. The interconnect substrate 1 may be configured such that one or more additional insulating layers and interconnect layers are laminated.

In the present embodiment, for the sake of convenience, the insulating layer 20 side of the interconnect substrate 1 in FIG. 1B is referred to as an upper side or a first side, and the insulating layer 40 side is referred to as a lower side or a second side. In addition, the surface of a member on the upper side is referred to as an upper surface or a first surface, and the surface of the member on the lower side is referred to as a lower surface or a second surface. Nonetheless, the interconnect substrate 1 can be used upside-down or can be arranged at any angle. In addition, a plan view refers to a view of an object taken in a direction normal to an upper surface 20a of the insulating layer 20, and a plane shape refers to the shape of an object viewed in the direction normal to the upper surface 20a of the insulating layer 20.

The pad 10 is used for external connection. The pad 10 can be used for electrical connection to a mounting substrate (not shown) such as a motherboard, for example. The pad 10 has a laminated structure. For example, a metal layer 13, which is the lowermost layer in contact with the insulating layer 20, is a copper layer (Cu layer), and a metal layer 12, which is the uppermost layer, is a gold layer (Au layer). The thickness of the metal layer 13 is, for example, approximately 10 to 30 µm.

The metal layer 12 may have a laminated structure in which the uppermost layer is an Au layer. The metal layer 12 may be, for example, a Ni/Au layer (i.e., a metal layer in which a Ni layer and an Au layer are stacked in this order on the metal layer 13), a Ni/Pd/Au layer (i.e., a metal layer in which a Ni layer, a Pd layer, and an Au layer are stacked in this order on the metal layer 13), or the like. When the metal layer 12 is a Ni/Pd/Au layer, for example, the thickness of the Ni layer is about 5 to 10 µm, and the thickness of the Pd layer is about 0.015 to 0.065 µm, with the thickness of the Au layer being about 0.030 to 0.090 µm.

The plane shape of the pad 10 is, for example, a circle having a diameter of about 600 µm to 800 µm. Alternatively, the planar shape of the pad 10 may be an elliptical shape, a rectangular shape, or any other shape.

The pad 10 is exposed on the upper surface 20a side of the insulating layer 20. As a material of the insulating layer 20, for example, an insulating resin containing an epoxy-based resin as a main component can be used. The insulating layer 20 may contain a filler such as silica ($SiO_2$). The thickness of the insulating layer 20 may be, for example, about 10 to 70 µm.

A portion of the lower surface of the pad 10 (i.e., a portion excluding a portion connected to the via interconnect) is covered with the insulating layer 20. The upper surface 10a of the pad 10 is situated at a position lower than the upper surface 20a of the insulating layer 20. The distance between the upper surface 10a of the pad 10 and the upper surface 20a of the insulating layer 20 is, for example, about 5 to 20 µm. The insulating layer 20 is provided with a groove 20g that is located around the pad 10 in a plan view and whose opening is on the upper surface 20a side of the insulating layer 20. When the plane shape of the pad 10 is circular, the groove 20g may be, for example, a ring shape such that the inner edge and outer edge thereof each have a circular shape with different diameters in a plan view. The width of the groove 20g may be, for example, about 80 µm to 100 µm.

The bottom surface of the groove 20g is, for example, at a position deeper than the lower surface of the pad 10 (i.e., the lower surface of the metal layer 13). Alternatively, the bottom surface of the groove 20g may be at the same position as the lower surface of the pad 10 (i.e., the lower surface of the metal layer 13), or may be at a position shallower than the lower surface of the pad 10 (i.e., the lower surface of the metal layer 13). The bottom surface of the groove 20g is located, for example, within ±30 µm from the lower surface of the pad 10 (i.e., the lower surface of the metal layer 13). That is, although the side surface of the pad 10 is generally exposed from the insulating layer 20, in one case the entire side surface of the pad 10 is exposed from the insulating layer 20, and in the other case a portion of the side surface of the pad 10 close to the upper surface 10a is exposed, with a portion thereof close to the lower surface being covered with the insulating layer 20.

The interconnect layer 30 is formed on the second side of the insulating layer 20. The interconnect layer 30 includes, for example, a via interconnect in a via hole 20x that penetrates the insulating layer 20 and that exposes the lower surface of the pad 10, and also includes both a via receiving pad formed on the lower surface of the insulating layer 20 and an interconnect pattern. The via interconnect extends through the insulating layer 20, and is in contact with the lower surface of the pad 10. The via hole 20x may be a truncated cone-shaped recess in which the size of the opening on the insulating layer 40 side is larger than the size of the back end of the hole at the lower surface of the pad 10. Copper or the like, for example, may be used as the material of the interconnect layer 30. The thickness of the via receiving pad and the interconnect pattern constituting the interconnect layer 30 may be, for example, about 10 to 30 µm.

The insulating layer 40 is formed on the lower surface of the insulating layer 20 so as to cover the interconnect layer 30. The material and thickness of the insulating layer 40 may be, for example, the same as those of the insulating layer 20. The insulating layer 40 may contain a filler such as silica (SiO2).

The interconnect layer 50 is formed on the other side of the insulating layer 40. The interconnect layer 50 includes, for example, a via interconnect in a via hole 40x that penetrates the insulating layer 40 and that exposes the lower surface of the via receiving pad of the interconnect layer 30, and also includes both a pad formed on the lower surface of the insulating layer 40 and an interconnect pattern. The via hole 40x may be a truncated cone-shaped recess in which the size of the opening on the lower surface side of the insulating layer 40 is larger than the size of the back end of the hole at the lower surface of the via receiving pad of the interconnect layer 30. The material of the interconnect layer 50 and the thicknesses of the via receiving pad and the interconnect pattern constituting the interconnect layer 50 may be the same as those of the interconnect layer 30, for example.

As described above, the interconnect substrate 1 is configured such that the insulating layer 20 is provided with the groove 20g that is located around the pad 10 in a plan view and whose opening is on the upper surface 20a side of the insulating layer 20. With this arrangement, the outer edge of the pad 10 can be situated further in than the perimeter of the opening of the insulating layer 20 (i.e., the outer edge of the groove 20g) in a plan view, so that the area of the upper surface 10a of the pad 10 can be made small. Reduction in the area of the upper surface 10a of the pad 10 enables the reduction of the electrostatic capacitance of the pad 10, thereby reducing the deterioration of an electric signal passing through the pad 10.

Figure 4A:
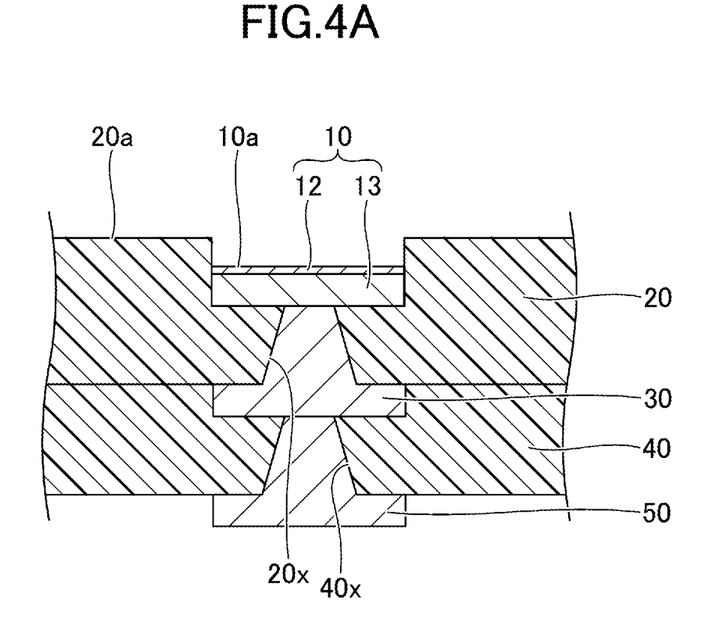
FIGS. 4A and 4B are drawings illustrating the method of making the interconnect substrate according to the first embodiment.

If the groove 20g were not provided, the position of the opening of the insulating layer 20 that exposes the upper surface 10a of the pad 10 would be arranged as illustrated in FIG. 4A, which will be described later. That is, in a plan view, the perimeter of the opening and the outer edge of the pad 10 would be located at the same position. In this case, if the area of the upper surface 10a of the pad 10 were made smaller than that of the conventional one, the size of the opening would also be made smaller, failing to ensure compatibility with conventional circuit substrates.

When a socket is used for connection to a mounting substrate such as a motherboard, the opening of the insulating layer 20 that exposes the upper surface 10a of the pad 10 has a size such that the socket does not come into contact with the insulating layer 20. Therefore, in order to reduce the electrostatic capacity of the pad 10 while ensuring the compatibility with conventional circuit substrates, it is necessary to reduce the area of the upper surface 10a of the pad 10 without changing the size of the opening of the insulating layer 20. By providing the groove 20g that is located around the pad 10 in a plan view and whose opening is on the upper surface 20a side of the insulating layer 20, it is possible to reduce the area of the upper surface 10a of the pad 10 while ensuring compatibility with conventional circuit substrates.

Further, when the pad 10 and a mounting substrate such as a motherboard are connected via solder, excess solder flows from the upper surface 10a of the pad 10 into the groove 20g, which reduces the likelihood of short-circuiting between adjacent pads. Further, the provision of solder entering the groove 20g enables three-dimensional bonding between the solder and the upper surface 10a and side surface of the pad 10, thereby improving the bonding strength between the pad 10 and the solder. In addition, in the interconnect substrate 1, since the bottom surface of the groove 20g is lower than the upper surface 10a of the pad 10, the center of gravity of the entire solder is located on the center side of the interconnect substrate 1. In particular, it is possible to significantly improve the durability of the solder against a force applied horizontally (in a direction parallel to the upper surface 10a). These effects relating to the bonding with the solder are especially prominent when the bottom surface of the groove 20g is at the same position as the lower surface of the pad 10 or situated lower than the lower surface of the pad 10.

Method of Making Interconnect Substrate

In the following, a method of making the interconnect substrate according to the first embodiment will be described. FIGS. 2A through 4B are drawings illustrating the method of making the interconnect substrate according to the first embodiment. This embodiment is directed to the process steps of making a single interconnect substrate. Alternatively, however, a plurality of structures to serve as respective interconnect substrates may be made as a single piece, followed by being separated into respective interconnect substrates.

Figure 2A:
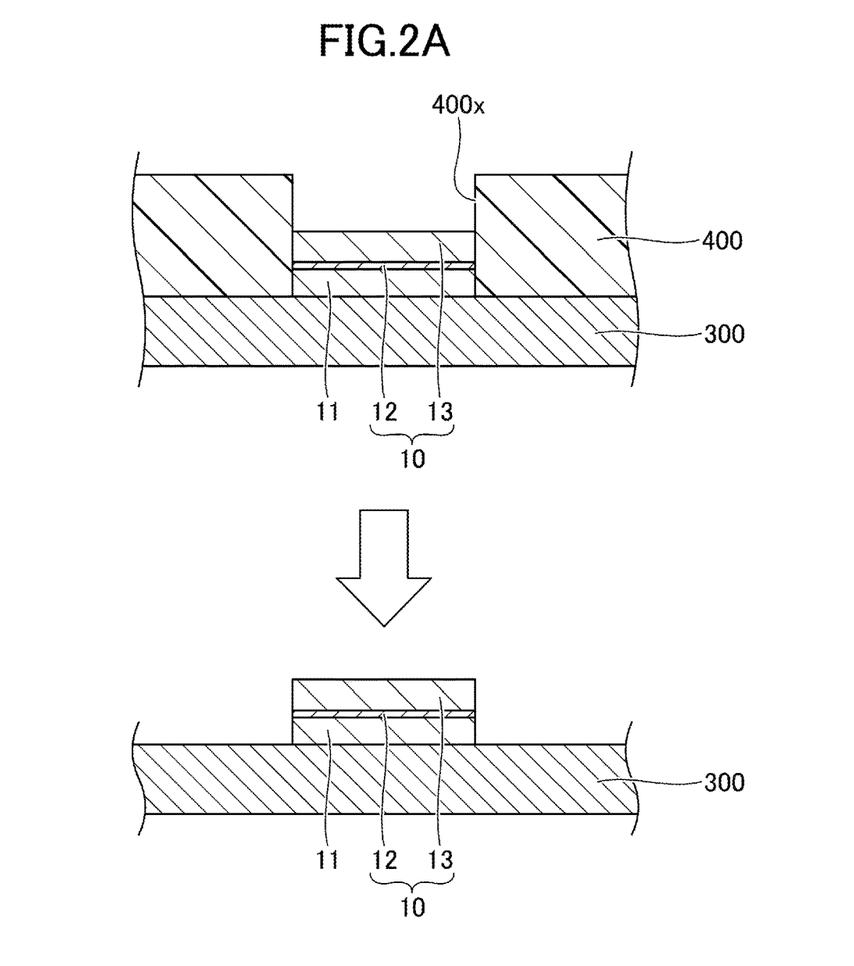
FIGS. 2A and 2B are drawings illustrating a method of making the interconnect substrate according to the first embodiment.

In the step illustrated in FIG. 2A, a support 300 having a flat upper surface is prepared. Although a metal plate, a metal foil, or the like can be used as the support 300, the support 300 made of a copper foil will be used as an example in the present embodiment. The thickness of the support 300 may be, for example, about 18 to 100 μm.

A resist layer 400 (for example, a dry film resist or the like) having an opening 400x in a portion where the pad 10 is to be formed is formed at a predetermined position on the upper surface of the support 300. A sacrificial layer 11 and a pad 10 for external connection are sequentially stacked on the upper surface of the support 300 exposed in the opening 400x of the resist layer 400 by an electrolytic plating method or the like using the support 300 as a plating power feed layer. Thereafter, the resist layer 400 is removed.

The pad 10 may be, for example, a laminated structure in which a metal layer 12 and a metal layer 13 are sequentially laminated on the sacrificial layer 11. The metal layer 12 may also be a laminated structure. In this example, the sacrificial layer 11 and the metal layer 13 are copper layers. The metal layer 12 is a laminated structure made by stacking a gold layer, a nickel layer, and a palladium layer in this order from bottom to top on the sacrificial layer 11. The thickness of each metal layer is as described above. The sacrificial layer 11 is a metal layer that is to be removed by etching in the end.

Figure 2B:
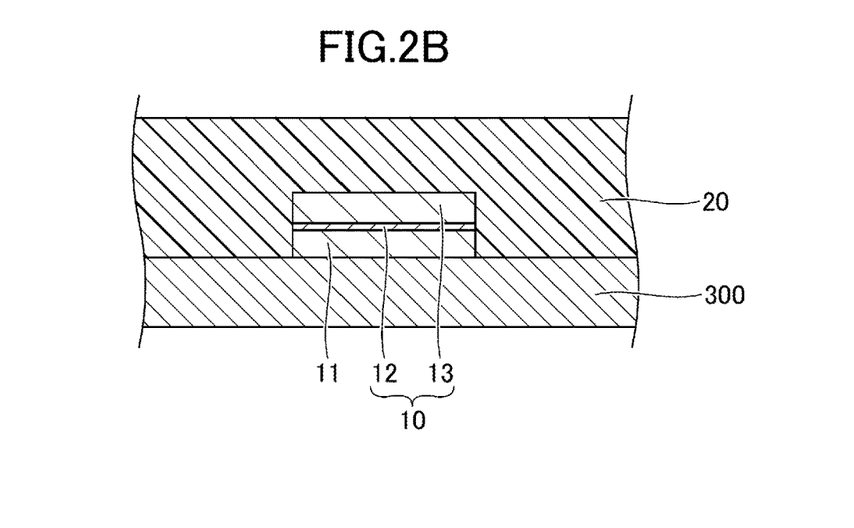

In the step illustrated in FIG. 2B, a semi-cured epoxy-based resin film or the like is laminated on the upper surface of the support 300 such that the lower surface of the film is in contact with the upper surface of the support 300 and such that the film covers the side surface of the sacrificial layer 11 as well as the upper surface and side surface of the pad 10. The film is cured to form the insulating layer 20. Alternatively, instead of laminating the epoxy-based resin film or the like, an epoxy-based resin liquid, paste, or the like may be applied and then cured to form the insulating layer 20. The thickness and the like of the insulating layer 20 are as described above.

Figure 3A:
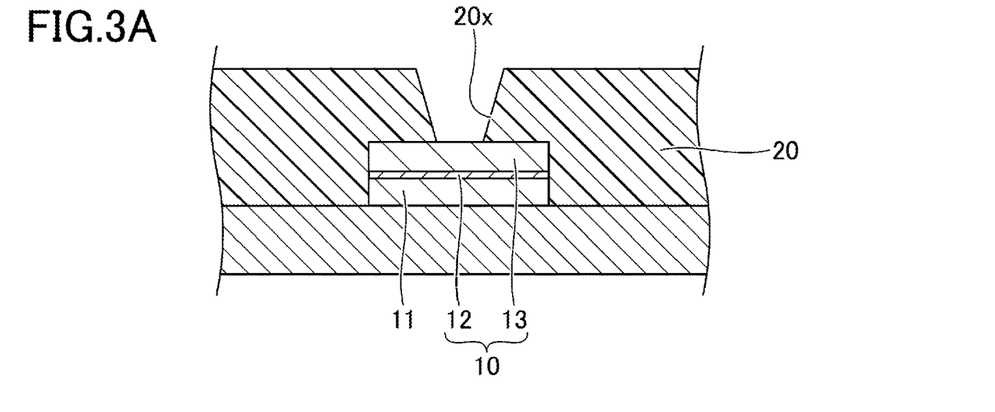
FIGS. 3A through 3C are drawings illustrating the method of making the interconnect substrate according to the first embodiment.

In the step illustrated in FIG. 3A, a via hole 20x is formed in the insulating layer 20 such as to extend through the insulating layer 20 and expose the upper surface of the pad 10. The via hole 20x can be formed by, for example, a laser processing method using a $CO_2$ laser or the like. Subsequently, a desmear process may be performed to remove residual resins adhering to the upper surface of the pad 10 exposed at the bottom of the via hole 20x.

Figure 3B:
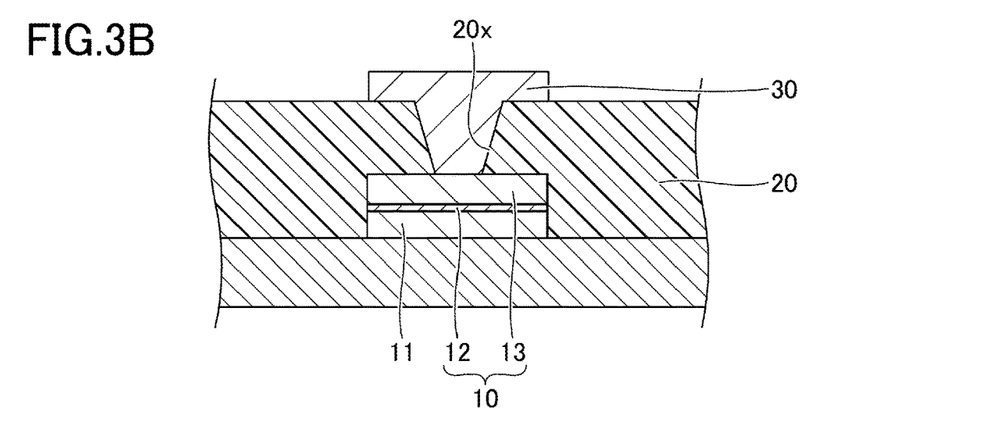

In the step illustrated in FIG. 3B, an interconnect layer 30 is formed on the insulating layer 20. The interconnect layer 30 includes, for example, a via interconnect filling the via hole 20x, a via receiving pad formed on the insulating layer 20, and an interconnect pattern. The interconnect layer 30 is electrically connected to the pad 10 exposed at the bottom of the via hole 20x. Copper (Cu) or the like, for example, may be used as the material of the interconnect layer 30. The interconnect layer 30 can be formed using various interconnect layer forming methods such as a semi-additive method and a subtractive method.

Figure 3C:
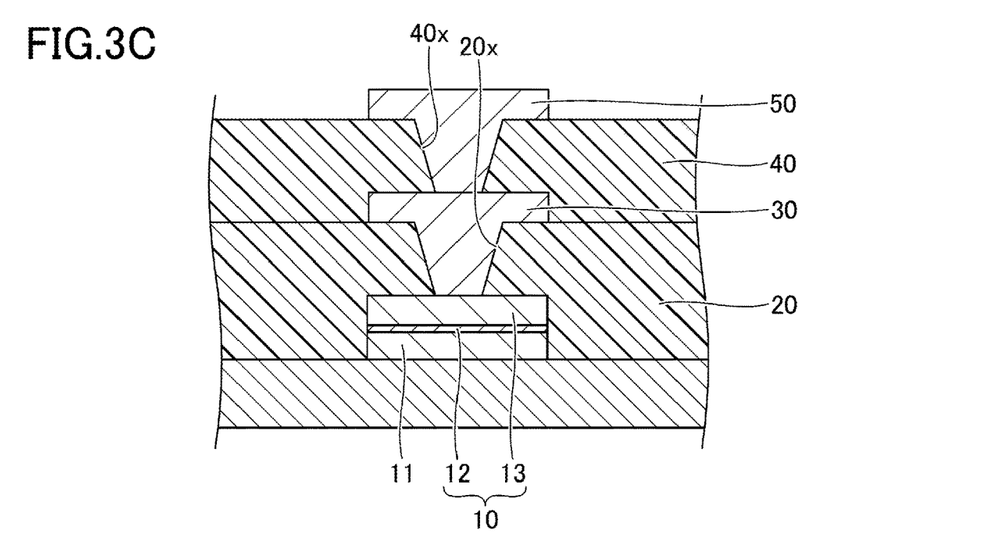

In the step illustrated in FIG. 3C, the same processes as those illustrated in FIGS. 2B through 3B are repeated to form an insulating layer 40 on the interconnect layer 30, to form a via hole 40x exposing the upper surface of the via receiving pad of the interconnect layer 30 in the insulating layer 40, and also to form an interconnect layer 50. The material and thickness of the insulating layer 40 may be, for example, substantially the same as the material and thickness of the insulating layer 20. The material and thickness of the interconnect layer 50 may be, for example, substantially the same as the material and thickness of the interconnect layer 30.

In the step illustrated in FIG. 4A, the support 300 is removed. The support 300 made of a copper foil can be removed by wet etching using, for example, a hydrogen peroxide and sulfuric acid-based aqueous solution, a sodium persulfate aqueous solution, an ammonium persulfate aqueous solution, or the like. Since the sacrificial layer 11 is also a copper layer, the sacrificial layer 11 is also removed simultaneously with the removal of the support 300.

The uppermost surface of the metal layer 12, which is a gold layer, is not removed by the etching solution for removing the copper layer, and serves as an etching stopper layer. The upper surface 10a of the pad 10 (i.e., the upper surface of the metal layer 12) is exposed at a position recessed from the upper surface 20a of the insulating layer 20. It may be noted that what is illustrated in FIG. 4A is upside down relative to FIG. 3C and the like. The same applies to FIG. 4B, which will be described below.

Figure 4B:
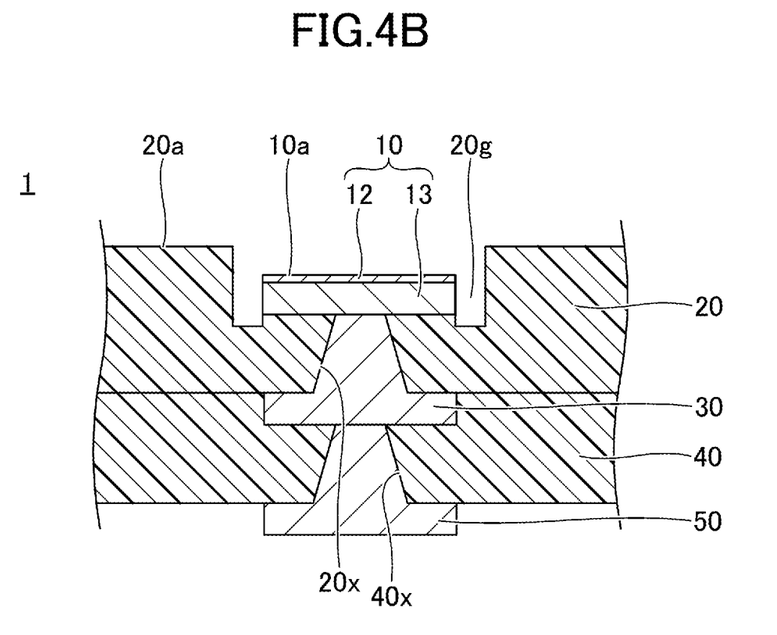

In the step illustrated in FIG. 4B, a groove 20g is formed in the insulating layer 20 around the pad 10 in a plan view such that the opening thereof is on the same side as the upper surface 20a of the insulating layer 20. The groove 20g can be formed by, for example, a laser processing method. The groove 20g is formed in a ring shape, for example, such that the inner edge and the outer edge have circular shapes with different diameters in a plan view. The bottom surface of the groove 20g is formed, for example, at a position deeper than the lower surface of the pad 10 (i.e., the lower surface of the metal layer 13). However, the bottom surface of the groove 20g may be formed at the same position as the lower surface of the pad 10 (i.e., the lower surface of the metal layer 13), or may be formed at a position shallower than the lower surface of the pad 10 (i.e., the lower surface of the metal layer 13). The position of the bottom surface of the groove 20g can be adjusted by the power of laser, and is formed within ±30 μm in the vertical direction from the lower surface of the pad 10 (i.e., the lower surface of the metal layer 13), for example. With this, the interconnect substrate 1 is completed in final form.

First Variation of First Embodiment

The first variation of the first embodiment is directed to an example in which an insulating layer covers the side surface of a pad. In the first variation of the first embodiment, a description of the same components as those of the previously described embodiment may be omitted.

Figure 5A:
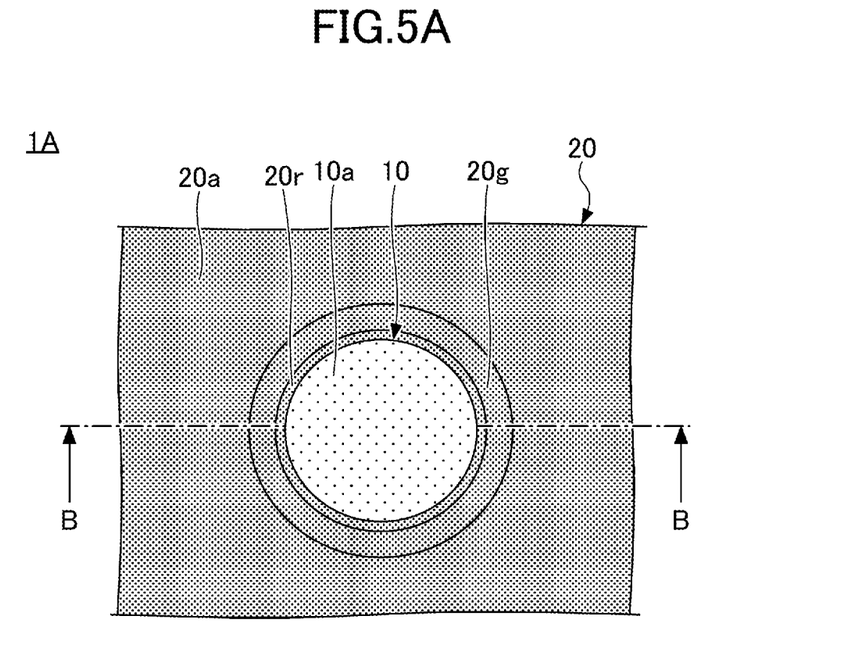
FIGS. 5A and 5B are drawings illustrating an interconnect substrate according to a first variation of the first embodiment.
Figure 5B:
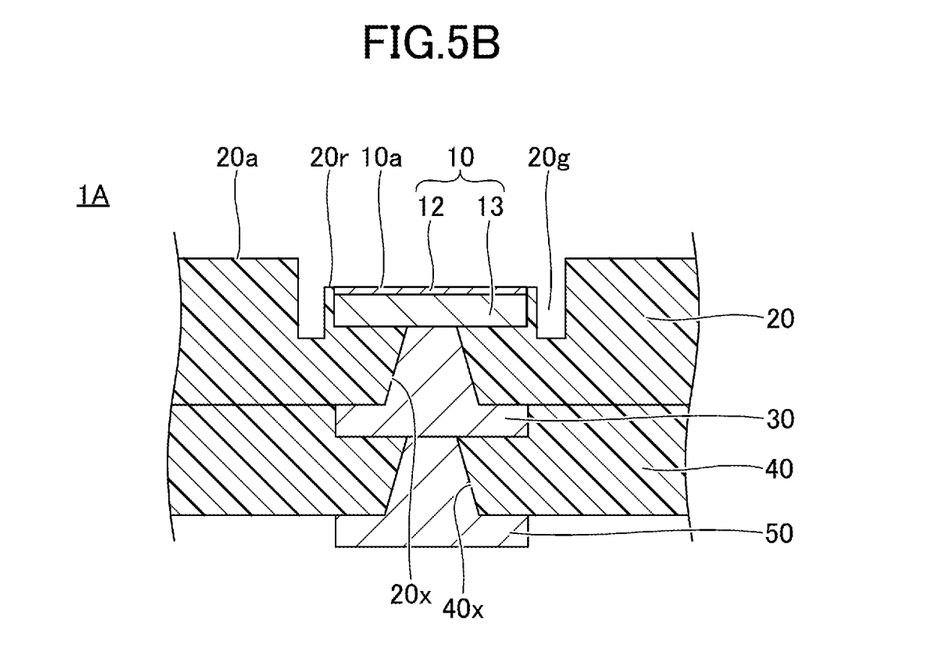

FIGS. 5A and 5B are drawings illustrating an interconnect substrate according to the first variation of the first embodiment. FIG. 5A is a partial plan view, and FIG. 5B is a partial cross-sectional view taken along the line B-B in FIG. 5A.

Referring to FIGS. 5A and 5B, an interconnect substrate 1A is different from the interconnect substrate 1 (see FIGS. 1A and 1B and the like) in that the entire side surface of the pad 10 is covered with the insulating layer 20. That is, the insulating layer 20 has a ring-shaped covering portion 20r covering the entire side surface of the pad 10 between the side surface of the pad 10 and the bottom surface of the groove 20g in a plan view. The width of the covering portion 20r is, for example, about 0.1 to 2 μm. The covering portion 20r may be formed by adjusting the position where the insulating layer 20 is irradiated with laser light for forming the groove 20g.

As described above, the side surface of the pad 10 may not necessarily be exposed from the insulating layer 20. Such an arrangement also reduces the area of the upper surface 10a of the pad 10 while ensuring compatibility with conventional circuit substrates, thereby enabling the reduction of electrostatic capacity of the pad 10.

Second Embodiment

The second embodiment is directed to an example of an interconnect substrate in which the pad has an alternative layer structure. In the second embodiment, a description of the same components as those of the previously described embodiment may be omitted.

Figure 6A:
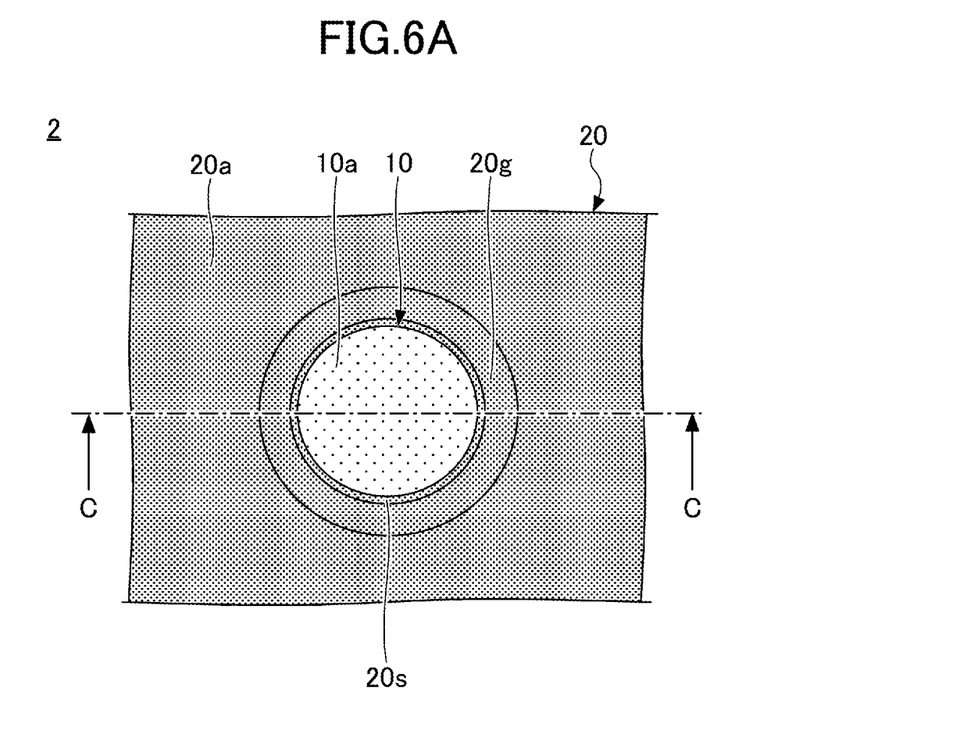
FIGS. 6A and 6B are drawings illustrating an interconnect substrate according to a second embodiment.
Figure 6B:
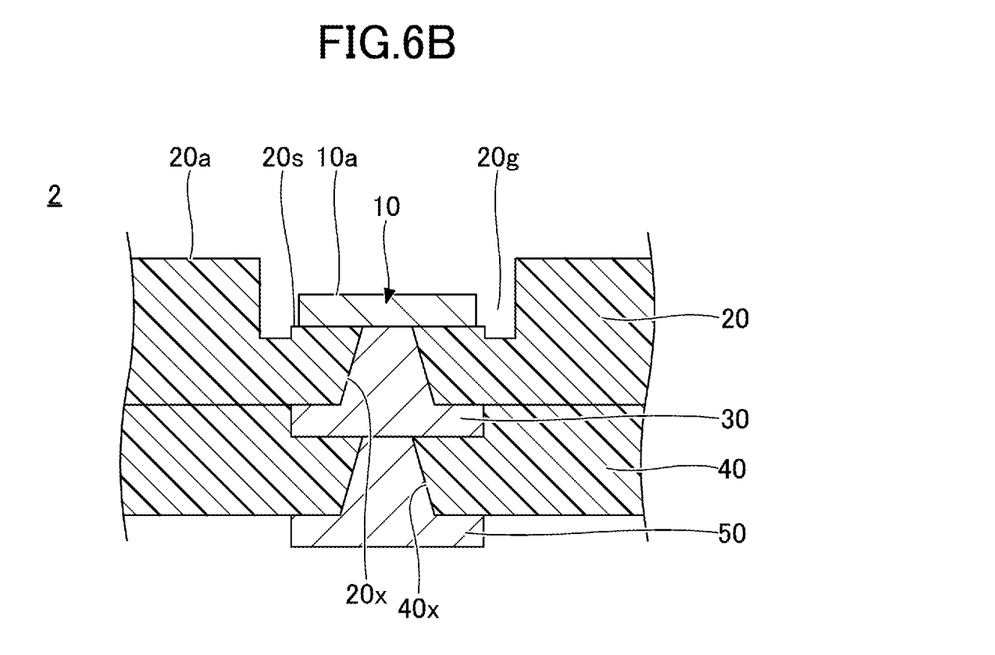

FIGS. 6A and 6B are drawings illustrating an interconnect substrate according to the second embodiment. FIG. 6A is a partial plan view, and FIG. 6B is a partial cross-sectional view taken along the line C-C in FIG. 6A.

Referring to FIGS. 6A and 6B, an interconnect substrate 2 is different from the interconnect substrate 1 (see FIGS. 1A and 1B and the like) in that the pad 10 has a single-layer structure. The pad 10 is, for example, a copper layer. The surface of the insulating layer 20 covering the lower surface of the pad 10 has, for example, an extending portion 20s extending in a ring shape between the side surface of the pad 10 and the bottom surface of the groove 20g in a plan view. The width of the extending portion 20s is, for example, about 0.5 to 3 μm. An organic film (not shown), for example, is formed on the upper surface 10a of the pad 10. The organic film may also cover the side surface of the pad 10. The organic film includes, for example, an azole compound, an imidazole compound, or the like.

The structure of the pad 10 and the insulating layer 20 illustrated in FIGS. 6A and 6B may be formed as follows, for example. First, in the step illustrated FIG. 2A, the sacrificial layer 11 is a copper layer, and the metal layer 12 is formed as a nickel layer. In this case, the metal layer 12 also serves as a sacrificial layer. After the steps of FIGS. 2B through 3C are performed, the support 300 and the sacrificial layer 11 are removed in the step illustrated in FIG. 4A, and then the metal layer 12 serving as the sacrificial layer is removed with an etching solution that etches nickel but does not etch copper.

Subsequently, a groove 20g is formed similarly to the manner described in connection with FIG. 4B. At this point in time, the inner edge of the groove 20g and the outer edge of the pad 10 are at the same position in a plan view. Then, in order to remove the oxide film formed on the upper surface 10a and the side surface of the pad 10, the upper surface 10a and the side surface of the pad 10 are etched about 2 to 3 μm. This results in the structure in which the surface of the insulating layer 20 covering the lower surface of the pad 10 has the extending portion 20s extending in a ring shape between the side surface of the pad 10 and the bottom surface of the groove 20g in a plan view. An organic solderability preservative (OSP) process is then performed on the pad 10 to form an organic coating.

In the case in which an organic film is not formed on the pad 10 having a single-layer structure, the etching process for removing the oxide film is not necessary. In this case, the inner edge of the groove 20g and the outer edge of the pad 10 are at the same position in a plan view, without the extending portion 20s being formed.

The second embodiment may be combined with the first variation of the first embodiment. In such an arrangement, the side surface of the single-layer pad 10 is covered with the insulating layer 20. An organic film, if any, is formed only on the upper surface 10a of the pad 10.

Third Embodiment

The third embodiment is directed to an example of an interconnect substrate having a plurality of pads. In the third embodiment, a description of the same components as those of the previously described embodiments may be omitted.

Figure 7A:
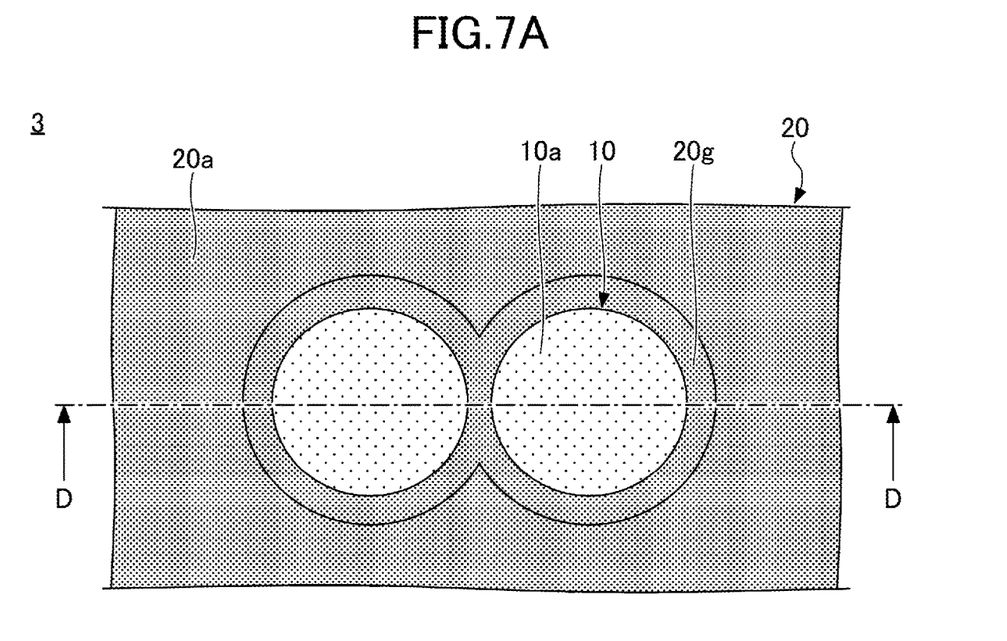
FIGS. 7A and 7B are drawings illustrating an interconnect substrate according to a third embodiment.
Figure 7B:
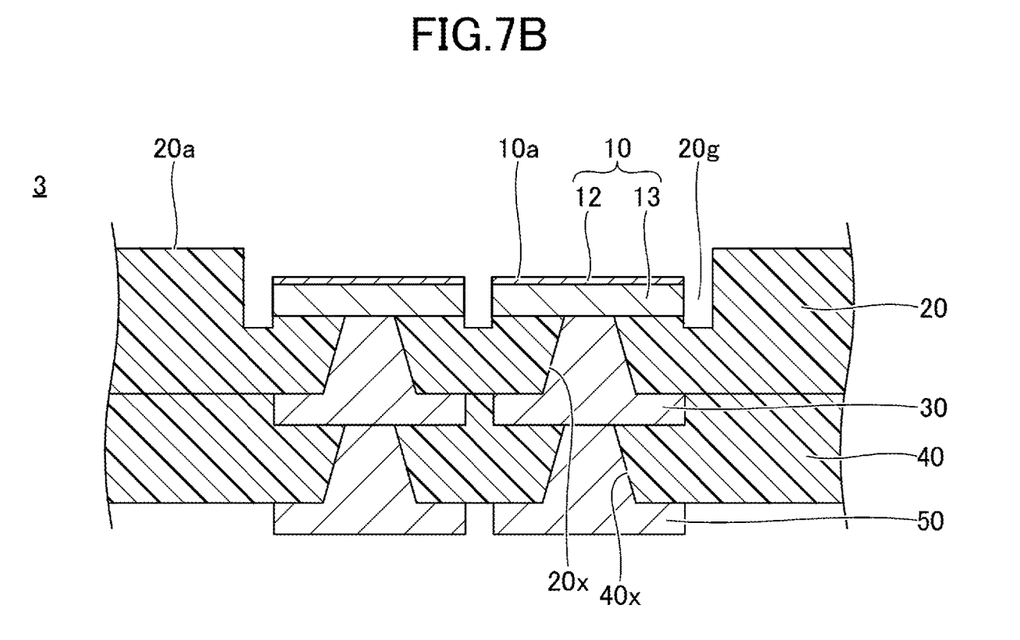

FIGS. 7A and 7B are drawings illustrating an interconnect substrate according to the third embodiment. FIG. 7A is a partial plan view, and FIG. 7B is a partial cross-sectional view taken along the line D-D in FIG. 7A.

Referring to FIGS. 7A and 7B, an interconnect substrate 3 has a plurality of pads 10. FIGS. 7A and 7B illustrate two adjacent pads 10 among the plurality of pads. Grooves 20g are present around the respective pads 10, and the grooves 20g around the adjacent pads 10 communicate with each other.

As described above, adjacent grooves 20g may communicate with each other. Such an arrangement is effective when the interval between adjacent pads 10 is narrow. The adjacent pads 10 may be pads at the same potential. For example, the adjacent pads 10 may be GND. In this case, there is no problem even if solder flows into the adjacent grooves 20g and electrically connects the adjacent pads 10.

In the case in which the adjacent pads 10 are at different potentials, solder may be formed only on the upper surface 10a of each pad 10.

The third embodiment may be combined with the first variation of the first embodiment and/or the second embodiment.

According to at least one embodiment, an interconnect substrate is provided in which the outer edge of a pad for external connection is located further in than the perimeter of an opening of an insulating layer in a plan view.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

One aspect of the subject-matter described herein is set out non-exclusively in the following clause.

[Clause] A method of making an interconnect substrate, comprising:

laminating a sacrificial layer and a pad for external connection at a predetermined position on an upper surface of a support, such that the sacrificial layer is situated between the pad and the support;

forming an insulating layer on the upper surface of the support, the insulating layer having a first surface in contact with the upper surface of the support and covering the sacrificial layer and the pad;

removing the support and the sacrificial layer; and forming a groove in the insulating layer, the groove being located around the pad in a plan view and having an opening on a same side as the first surface of the insulating layer.

What is claimed is:

1. An interconnect substrate, comprising:
a pad for external connection, the pad having an entirely planar shape; and
an insulating layer,
wherein a portion of a lower surface of the pad is in direct contact with the insulating layer,
wherein an upper surface of the pad is situated at a lower position than an upper surface of the insulating layer,
wherein a groove whose bottom surface is formed by the insulating layer completely surrounds the pad in a plan view, and has an opening on an upper surface side of the insulating layer,
wherein a bottom surface of the groove is at a lower position than the lower surface of the pad, and
wherein a surface of the insulating layer under the pad, which surface is in direct contact with the pad, is at a higher position than the bottom surface of the groove.

2. The interconnect substrate as claimed in claim 1, wherein a side surface of the pad is exposed from the insulating layer.

3. The interconnect substrate as claimed in claim 1, wherein the insulating layer has a covering portion that covers an entire side surface of the pad and that is situated between the side surface of the pad and the bottom surface of the groove in a plan view.

4. The interconnect substrate as claimed in claim 1, wherein the pad has a laminated structure in which a lowermost layer in contact with the insulating layer is a copper layer, and an uppermost layer is a gold layer.

5. The interconnect substrate as claimed in claim 1, wherein the pad has a single-layer structure made of a copper layer, and an organic film is formed on a surface of the pad exposed from the insulating layer.

6. An interconnect substrate, comprising:
a pad for external connection, the pad having an entirely planar shape; and
an insulating layer,
wherein a portion of a lower surface of the pad is covered with the insulating layer,
wherein an upper surface of the pad is situated at a lower position than an upper surface of the insulating layer,
wherein a groove whose bottom surface is formed by the insulating layer completely surrounds the pad in a plan view, and has an opening on an upper surface side of the insulating layer,
wherein a bottom surface of the groove is at a lower position than the lower surface of the pad,
wherein the pad has a single-layer structure made of a copper layer, and an organic film is formed on a surface of the pad exposed from the insulating layer, and
wherein a surface of the insulating layer covering the lower surface of the pad extends to form an extending portion extending between a side surface of the pad and the bottom surface of the groove in a plan view, and the extending portion is at a higher position than the bottom surface of the groove.

7. The interconnect substrate as claimed in claim 1, comprising a plurality of said pads, wherein a plurality of said grooves are each situated around a respective one of the pads, and
wherein the grooves include adjacent grooves situated around adjacent pads, and the adjacent grooves communicate with each other.

8. The interconnect substrate as claimed in claim 1, further comprising an interconnect layer formed on a lower surface of the insulating layer, and the interconnect layer includes a via interconnect extending through the insulating layer and touching the lower surface of the pad.

9. The interconnect substrate as claimed in claim 1, wherein a side surface of the groove extends straight from the bottom surface of the groove to the upper surface of the insulating layer.

* * * * *